United States Patent [19]

Koch et al.

[11] 3,996,522
[45] Dec. 7, 1976

[54] CRYSTAL CONTROLLED STEPPING RADIO RECEIVER HAVING NOVEL OSCILLATOR CIRCUIT

[75] Inventors: Richard C. Koch, Denver, Colo.; Stephen J. Hoffman, Indianapolis, Ind.

[73] Assignee: Regency Electronics Inc., Indianapolis, Ind.

[22] Filed: Nov. 17, 1975

[21] Appl. No.: 632,473

[52] U.S. Cl. .............................. 325/471; 325/334; 325/470
[51] Int. Cl.² ........................................ H04B 1/34
[58] Field of Search .......... 325/470, 334, 206, 471; 331/159

[56] References Cited
UNITED STATES PATENTS 3,750,032   7/1973   Andrews .................... 325/470 UX Primary Examiner—Harold I. Pitts
Attorney, Agent, or Firm—Woodard, Weikart, Emhardt & Naughton

[57] ABSTRACT

A signal-seeking radio receiver is disclosed which has two different types of local oscillator circuits. One type of local oscillator includes two transistors, the emitter of the first connecting to the base of the second and having a capacitor connecting between the emitter of the second and the base of the first. A large number of diode switched crystals can be connected to the base of the first transistor of the local oscillator without introducing an instability in the oscillator circuit. The second type of local oscillator is of the same general design as the first type except that it additionally includes a third transistor connected to the second transistor in a fashion similar to the first transistor. In this second oscillator configuration, the circuitry used to step among the channels also is used to alternately make either the first or third transistor operative in the local oscillator circuit.

13 Claims, 4 Drawing Figures

3,996,522

CRYSTAL CONTROLLED STEPPING RADIO RECEIVER HAVING NOVEL OSCILLATOR CIRCUIT

BACKGROUND OF THE INVENTION

The invention relates to signal-seeking radio receivers and in particular to stepping radio receivers for the production of audio signals from radio frequencies signals. More specifically the invention relates to the use of an improved local oscillator circuit in such radio receivers.

A typical local oscillator circuit for use in a stepping radio receiver of the prior art is shown in U.S. Pat. No. 3,665,318 to Hoffman et al. The local oscillator of Hoffman works quite well with a radio receiver having 8 channels. It can also be used with stepping radio receivers having up to 10 to 12 channels. However, when the number of crystals used in the receiver substantially exceeds about 10 crystals, not only do stability problems result due to the increased capacitance of all the crystals and associated switching diodes, but additionally crystal frequencies tend to change. Therefore, when receivers were built for 16 channels using an oscillator circuit of the type shown in Hoffman et al, two separate oscillators were used, each with a capacity of 8 channels. This resulted in a more expensive product than one which would result from the use of a single oscillator, but it did provide reliable and stable operation on all of the 16 channels.

U.S. Pat. No. 3,824,475 to Pflasterer discloses a stepping radio receiver having a local oscillator which can accommodate up to 16 crystals. This basic oscillator design does not produce signals which can be used both with the low and high band VHF mixers as does the local oscillator in Hoffman, but rather it requires an additional stage to triple the output of the basic local oscillator to achieve the high band injection frequency.

The prior art literature discloses a multi-channel crystal oscillator which groups crystals into two separate groups which groups are later fed to the same oscillator element. A circuit of this type is disclosed in an article by Hilton et al., appearing in Electronic Design, Volume 13, June 21, 1969. This circuit design has, according to the disclosure, a limit of up to 5 channels per grouping. It is generally recognized in the prior art that difficulties are encountered when attempts are made to have large numbers of crystals operable with the same oscillator circuit when the crystals are switched with an electronic equivalent of a stepping switch.

U.S. Pat. No. 3,713,045 discloses a two stage oscillator circuit having a grounded collector configuration and a high impedance input for use with a tuning fork vibrator oscillator. In this circuit the base of the first transistor connects to the tuning fork, its collector to ground and its emitter to the base of the second transistor. The collector of the second transistor connects to a parallel LC circuit tuned to the resonant frequency of the tuning fork. Feed back for the oscillator is obtained from the stepped up voltage on the LC circuit coupled through a resistor back to the tuning fork. This particular configuration of two transistors apparently was found to be desirable for tuning fork oscillators. However, the crystal oscillator circuit disclosed in the same patent did not incorporate this type of circuitry.

SUMMARY OF THE INVENTION

One aspect of the invention relates to an improved crystal controlled stepping radio receiver having an oscillator which includes two transistors. The emitter of the first transistor connects directly to the base of the second transistor and the base of the first transistor connects to the crystals. The collector of the first transistor is at AC ground, a capacitor connects between the emitter of the second transistor and the base of the first transistor, and a parallel LC circuit couples from the emitter of the second transistor to ground. The addition of the first transistor to the second transistor provided an oscillator circuit which can operate with a substantially larger number of crystals than would otherwise be the case. The modification to the crystal oscillator circuit is inexpensive and very importantly does not change the crystal correlation. In other words, the improved circuit will oscillate on the same frequency with a given crystal as did the prior art circuit, therefore crystals can be interchanged between units designed with the prior art circuit and units using the oscillator circuit of the invention.

Another variety of local oscillator circuits which additionally does not interfere with the crystal correlation and which provides an even larger number of crystals is similar to the above described circuit but additionally includes a third transistor connected in a similar manner to the first transistor. The first and third transistors are then connected to the stepping means of the stepping radio receiver to render them alternately operable in synchrony with the stepping means of the stepping receiver. This not only enables the use of a larger number of crystals than would otherwise be possible but additionally it improves operation of the prior art oscillator circuit. The local oscillator includes an automatic frequency control circuit using a varactor in a parallel LC circuit connected to the emitter of the second transistor. It can be noted in the two varieties of local oscillator circuits disclosed herein that RF resonant circuits are only needed in association with the second transistor. This minimizes cost and space and yet achieves a very stable oscillator which functions with large numbers of crystals.

It is therefore an object of the invention to provide a stepping radio receiver which can accommodate a large number of crystals with a minimum of oscillator components. It is a further object of the invention to provide a stepping radio receiver which can operate either on the UHF band or on the high or low VHF band with as many as 20 crystals in any band.

It is a further object of the invention to provide an improved oscillator circuit which does not change the frequencies of crystals used in prior art oscillator circuits. Other objects and advantages of the present invention will become apparent from the following detailed description of the preferred embodiment particularly when taken in conjunction with the accompanying drawings in which:

FIG. 1A is the left side and FIG. 1B is the right side of a block diagram illustrating the preferred embodiment of a stepping radio receiver of the present invention. Wire interconnections between FIGS. 1A and 1B are obtained by registering wire ends on the right side of FIG. 1A with the corresponding wire ends on the left side of FIG. 1B. The combination of FIGS. 1A and 1B shall hereinafter be referred to as FIG. 1.

DESCRIPTION OF THE PREFERRED EMBODIMENT

Figure 1A:
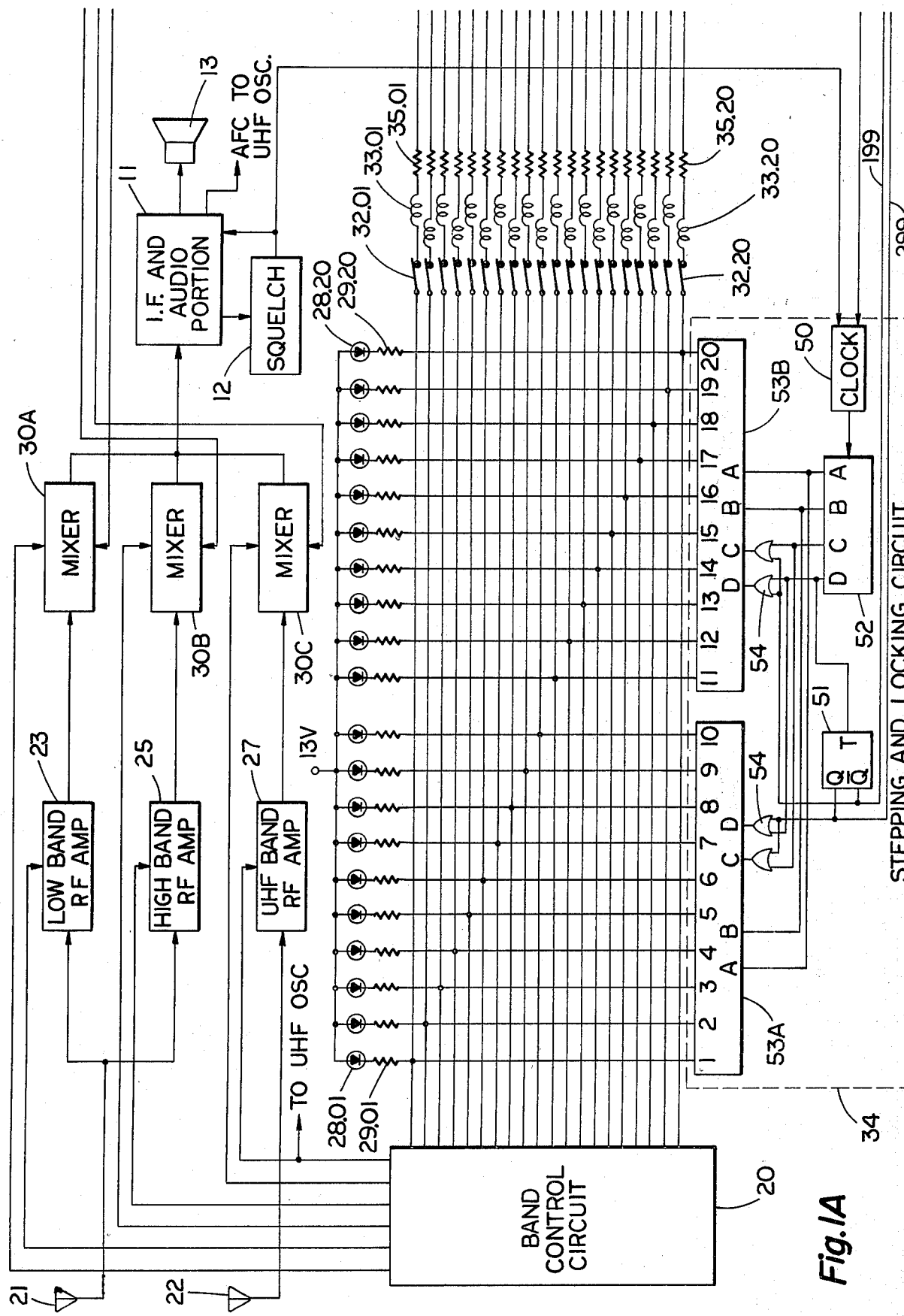
Figure 1B:
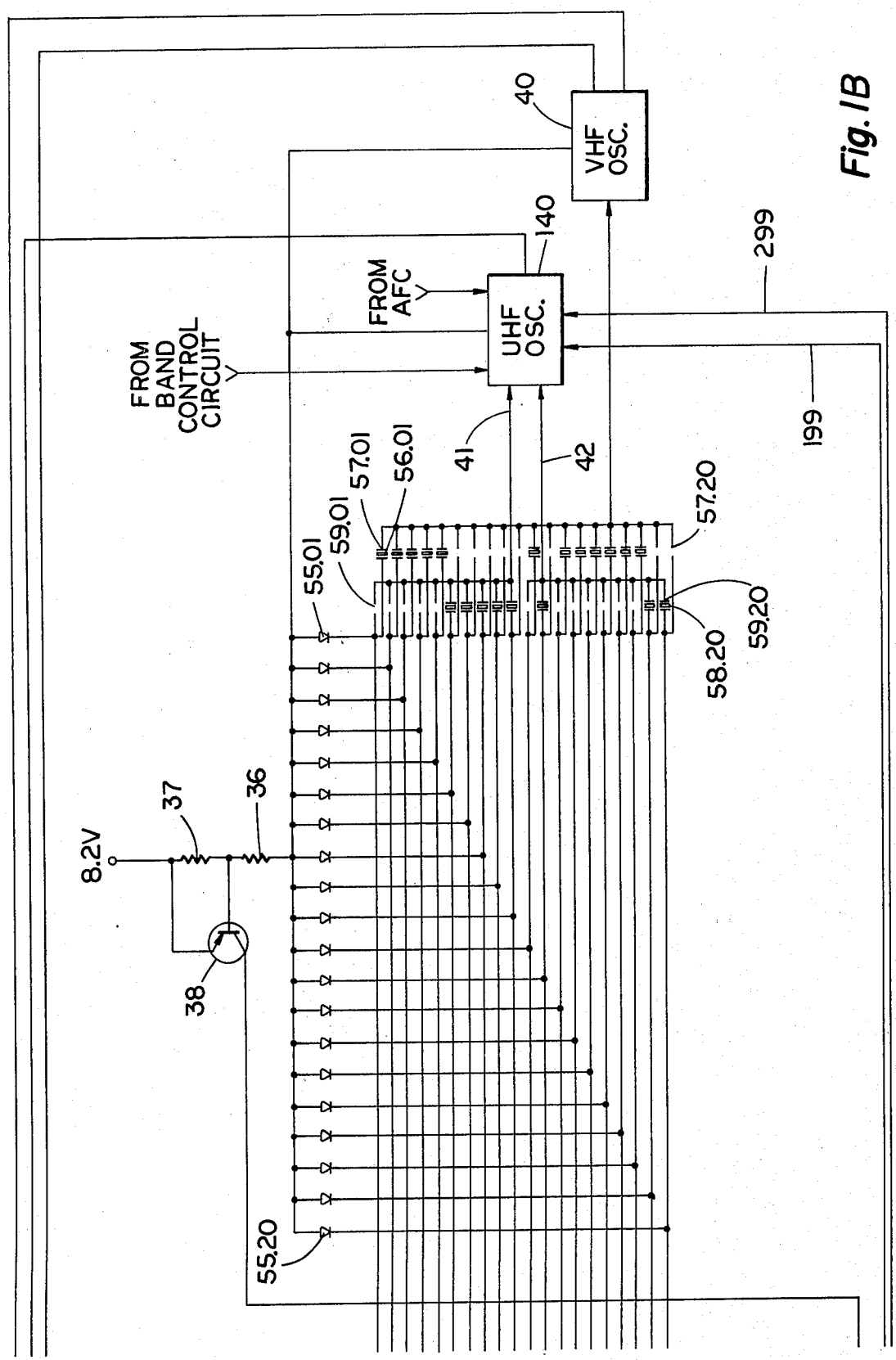

Referring now more particularly to the drawings there is illustrated in FIG. 1 a block diagram of the preferred embodiment of a stepping radio receiver of the present invention. The receiver is designed for production of audio signals from audio modulated radio frequency signals and would normally operate on three bands to receive FM signals thereon. The bands of operation are low band VHF, high band VHF and UHF band. Details of the band control circuitry 20 are more fully explained in copending patent application Ser. No. 632,474 filed by Kenneth R. Owens and entitled Signal-Seeking Radio Receiver with Band Tuning and Selecting Means, filed Nov. 17, 1975.

The receiver includes an RF signal receiving means which includes antennas 21 and 22 and low band RF amplifier 23, high band RF amplifier 25 and UHF band RF amplifier 27. The RF signal receiving means is controlled in part by the band control circuit 20 and provides outputs having sufficient RF signal level for the mixers 30A, 30B and 30C. The band control circuit 20 functions to allow only reception on one band at a time. The output of mixers 30A, 30B and 30C provide an intermediate frequency to the IF and audio portion 11 which provides an audio signal to the speaker 13 when squelch circuit 12 permits. The IF and audio portion 11, squelch 12 and speaker 13 function as an audio detection means for producing an audio signal when an audio modulated RF signal is being received. The squelch circuit 12 prevents the production of audio signals when an RF signal is not being received to avoid the objectional noise which would otherwise be heard.

This stepping radio receiver of this invention includes a stepping and locking circuit 34 which is defeatable by the action from the squelch circuit 12 and which has 20 outputs which couple to the oscillator for stepping the oscillators through their 20 frequencies of operation. Stepping and locking circuit 34 includes a clock circuit 50, a frequency dividing circuit 51 which divides by 2, a binary coded decimal counter 52, 4 OR gates 54, and two decade decoders 53A and 53B. These components provide the electronic equivalent of a 20 position stepping switch. The operation of the stepping and locking circuits 34 is such that only one of its 20 outputs is "on" at a given time. The outputs normally sequence in order from 1 to 20 and then begin again at 1. This functions to step the oscillator through each of its 20 frequencies. Decoders 53A and 53B may be Motorola integrated circuits 74145. When an output of the stepping and locking circuit 34 is "on", it approaches ground potential. When an output is "off", it acts essentially as an open circuit. The stepping and locking circuit 34 is defeatable by action of the squelch circuit 12. This action defeats the stepping as long as an RF signal is being received and allows resumption of automatic stepping when no signal is being received.

The frequency to which the receiver is being tuned is indicated by light emitting diodes 28.01 through 28.20. Current through these diodes is controlled by resistors 29.01 through 29.20. To improve clarity of this disclosure, item numbers have been omitted from the second through the nineteenth light emitting diodes and switches, and it may be assumed that they bear the numbers in 0.01 increments from 28.01 to 28.19 consecutively and respectively for the light emitting diodes and 29.02 to 29.19 consecutively and respective for the resistors. Similarly where there are 20 individual identical items set forth, only integer item numbers will be given for the item with decimel points being reserved for the number of the specific one in the grouping of 20 items.

Individuals switches 32.01 to 32.20 control the individual channels. When any one of the 20 switches 32.01 to 32.20 are open, the channel corresponding to that switch is rendered inoperative and the channel indicator 28.10 through 28.20 is effectively rendered inoperative. The opening of one of the switches of the 20 switches 32.01 to 32.20 prevents current from flowing through the corresponding inductor of inductors 33.01 to 33.20 and the corresponding resistor of resistors 35.01 to 35.20 and the corresponding diode of diodes 55.01 to 55.20. This prevents current from flowing through resistors 36 and 37 which connect to the 8.2 volt supply and therefore prevents conduction of transistor 38. This in turn causes clock 50 to operate at a very high rate of speed thereby effectively skipping the channel.

Two local oscillators are used in the receiver of FIG. 1. The VHF oscillator 40 can operate with up to 20 crystals and produces a first output usable by the low band mixer 30A as well as a second output at three times the frequency of the first output usable by the high band mixer 30B. Which mixer is actually operating depends on band control circuit 20. VHF oscillator 40 has its input connected to 20 crystal sockets 57.01 to 57.20 in which may be placed as many as 20 crystals. There are illustrated a total of 12 crystals (56.01 through 56.05, 56.11 and 56.13 through 56.18) which function in the VHF oscillator.

UHF oscillator 140 has one output which provides the injection frequency for mixer 30C. The oscillator has two distinct and separate inputs, one input connecting to a first group of 10 crystal sockets 59.01 to 59.10 and the other input connecting to a second group of 10 different sockets 59.11 to 59.20. The first input of the UHF oscillator 41 has connected to it five crystals 58.06 through 58.10 which have been placed in the corresponding crystal sockets 59.06 through 59.10. This second input 42 of the UHF oscillator 140 has connected to it crystals 58.12, 58.19 and 58.20 placed respectively in corresponding crystal sockets 59.12, 59.19 and 59.20.

Figure 2:
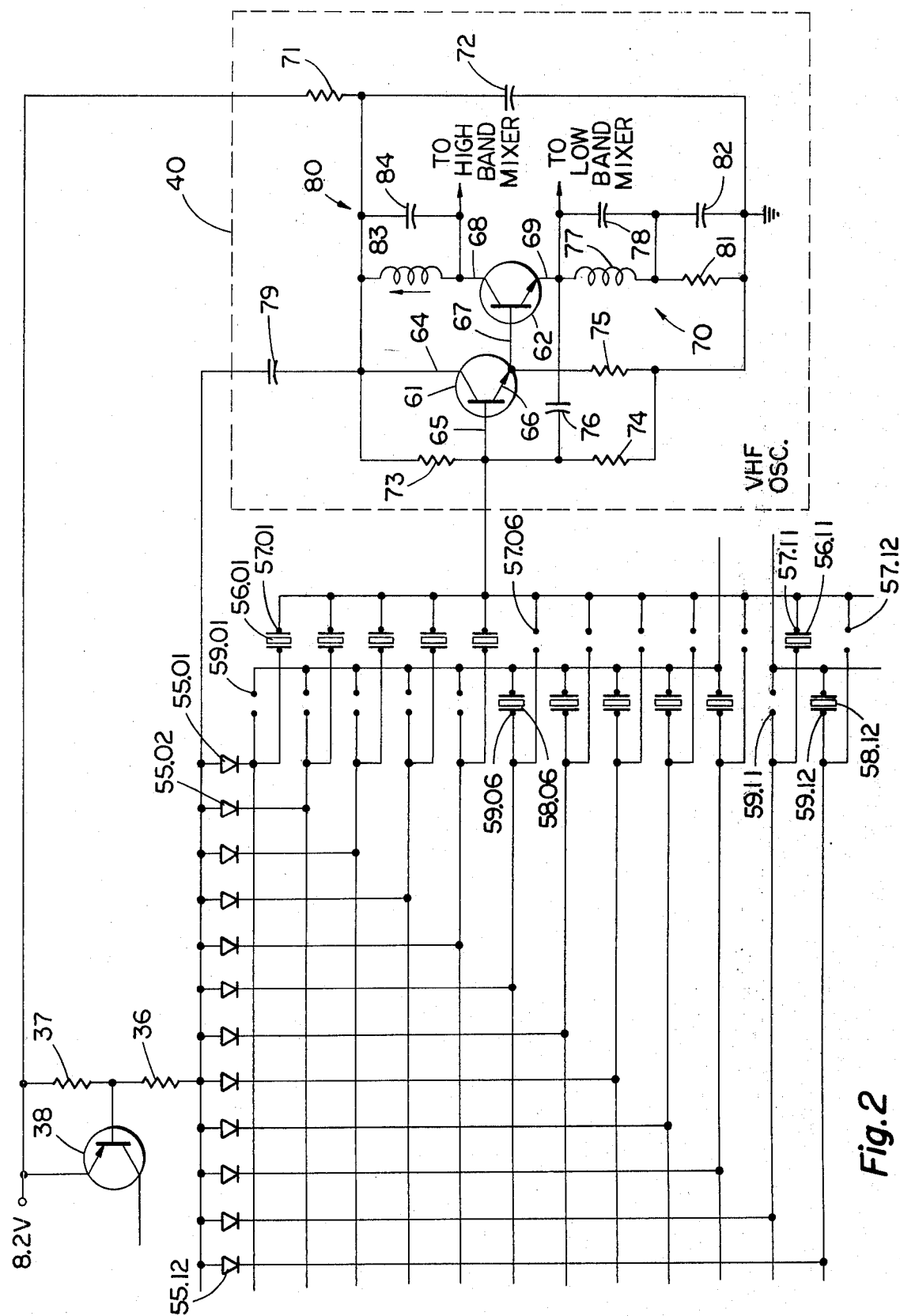
FIG. 2 is a circuit diagram of the VHF oscillator portion of the receiver of FIGS. 1A and 1B.

Referring more particularly to FIG. 2 there is illustrated details of the VHF oscillator 40. The VHF oscillator 40 includes a first transistor 61 having a collector 64, a base 65 and an emitter 66. Emitter 66 connects to the base 67 of transistor 62 which also has a collector 68 and an emitter 69. The transistors are supplied with voltage through resistor 71 and a capacitor 72 filters the voltage to remove any AC signals and to essentially make the collector 64 of transistor 61 at AC ground.

Transistor 64 is biased to an operating condition by resistors 73 and 74. Resistor 75 connects emitter 66 to ground. A capacitor 76 connects emitter 69 of transistor 62 to base 65 of transistor 61 to provide a phase shift within the oscillator circuit which is important for proper oscillation of the oscillator. The oscillator circuit is caused to operate on the third overtone of crystals connected to the base 65 of transistor 61 by an LC circuit 70 connected to emitter 69 of transistor 62. This LC circuit includes an inductor 77 and a capacitor 78. LC circuit 70 is coupled to ground through resistor 81 and capacitor 82. A parallel LC circuit 80 which includes inductor 83 and capacitor 84 is tuned to approximately 3 times the operating frequencies of the crystals. A capacitor 79 connects between the collector 64 of transistor 61 and one side of diodes 55.01 through 55.20.

Figure 3:
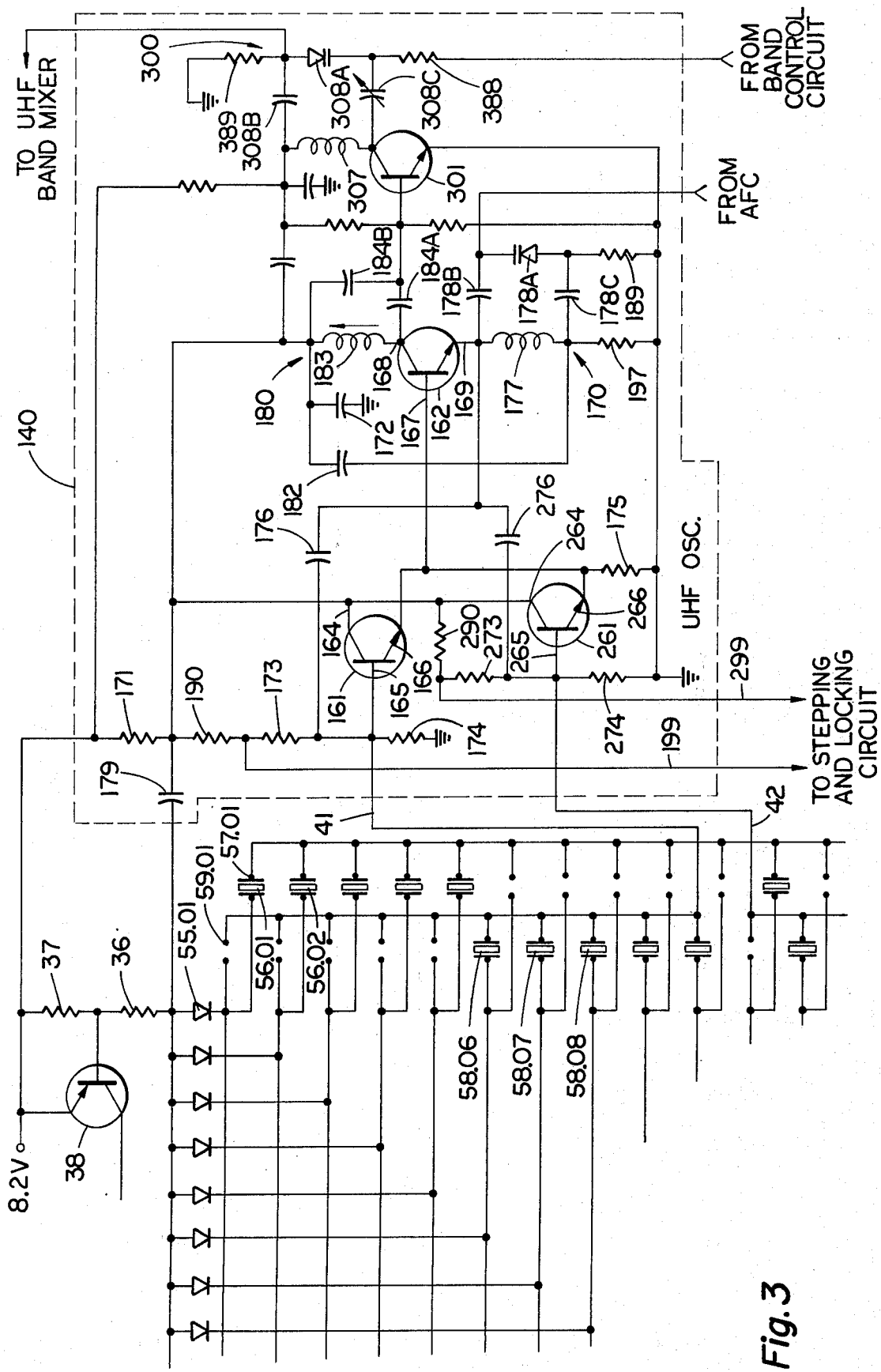
FIG. 3 is a circuit diagram of the UHF oscillator portion of the receiver of FIGS. 1A and 1B.

Referring now in particular to FIG. 3 there is illustrated in more detail the UHF oscillator circuit 140 and associated crystal and diode switching circuitry of FIG. 1. A first transistor 161 with collector 164, base 165 and emitter 166 has its emitter 166 connected to base 167 of a second transistor 162. A third transistor 261 having collector 264, base 265 and emitter 266 has its emitter 266 connected in a similar manner to the base 167 of transistor 162. It can be noted that the corresponding emitters 166 and 266 of transistors 161 and 261 are connected together and to the base 167 of transistor 162. A resistor 175 also connects emitters 166 and 266 to ground.

Collectors 164 and 264 or transistors 161 and 261 connect through resistor 171 to an 8.2 volt supply. Capacitor 172 assures that collectors 164 and 264 have no AC component thereon and therefore are at AC ground. Capacitor 176 and 276 connect from emitter 169 of transistor 162 respectively to bases 165 and 265 of transistor 161 and 261. A capacitor 179 connects from diodes 55.01 to 55.20 to the collectors 164 and 264 of transistors 161 and 261. Transistors 161 and 261 are caused to operate alternately in synchrony with the stepping and locking circuit 34. This is accomplished by the connection to the stepping and locking circuit 34 and more particularly to the dividing circuit 51, through lines 199 and 299 of the base biasing circuitry. The base bias for transistor 161 is provided by the series of resistors 174, 173, and 190 which connects between a source of filtered voltage and ground. Similarly transistor 261 is provided with a base bias through resistors 274, 273 and 290. Dividing circuit 51 alternately provides line 199 and 299 with an approximately ground potential. When line 199 is at ground potential transistor 161 is rendered inoperative and only transistor 261 operates. When dividing circuit 51 changes state, line 299 goes low, rendering transistor 261 inoperative, and line 199 goes high, rendering transistor 161 operative. Because of the connection of these transistors 161 and 261 to the dividing circuit 51, they are caused to be rendered alternately operable in synchrony with the stepping and locking circuit 34.

The second transistor 162 of the UHF oscillator circuit 140 has a parallel LC circuit 170 connected to its emitter 169. The parallel LC circuit 170 includes an inductor 177 and 3 capacitors 178B, 178A and 178C in series. Capacitor 178A is a varactor diode and varies in capacitance according to a control signal applied to it from the AFC circuitry. Resistor 189 provides a current path to ground through the varactor diode 178A when signals are applied from the AFC circuit. LC circuit 170 is principally coupled to ground through resistor 197 and capacitor 182 in association with capacitor 172. The collector of transistor 162 has connected to it an LC circuit 180 which includes an inductor 183 and two capacitors 184A and 184B.

As was the case with the VHF oscillator circuit 41, UHF oscillator circuit 140 operates on the third overtone of the crystals due to the resonant frequency of the parallel LC circuit 170. Parallel LC circuit 170 is tuned somewhat below the third overtone of the crystals. The parallel LC circuit 180 is tuned to approximately three times the operating frequencies of the crystals. The output from parallel LC circuit 180 is taken from the point of connection of capacitors 184A and 184B. This output signal is then tripled by a transistor stage which includes transistor 301.

The collector of transistor 310 is connected to a parallel LC circuit 300 which is tuned to approximately three times the frequency of parallel LC circuit 180. Parallel LC circuit 300 includes an inductor 307 and three capacitors 308B, 308A and 308C. The output of the UHF oscillator circuit 140 is taken from the point of connection of capacitors 308A and 308C. Capacitor 308C is a variable capacitor which may be tuned for alignment purposes. Capacitor 308A is a varactor diode whose capacitance is controlled by a signal from the band control circuit 20 through resistors 388 and 389. Depending upon whether the band control circuit is programmed for operation in the upper half of the UHF band or the lower half of the UHF band, the varactor diode 308A will correspondingly tune the parallel LC circuit 300.

While there have been described above the principles of this invention in connection with a specific apparatus it is to be clearly understood that this description is made only by way of example and not as a limitation to the scope of the invention.

What is claimed is:
1. In a stepping radio receiver for production of audio signals from radio frequency signals and capable of tuning to several separate channels which radio receiver includes:
   a. an RF signal receiving means, a mixer, and an oscillator means;
   b. said RF signal receiving means being for providing sufficient RF signal level for said mixer means;
   c. said RF signal receiving means and said oscillator means being coupled to said mixer means;
   d. an audio detection means coupled to said mixer means for producing an audio signal when an RF signal is being received, said audio detection means including squelch means for preventing the production of an audio signal when an RF signal is not being received;
   e. said oscillator means being coupled to said mixers and operable at a given several frequencies, there being one frequency for each channel to which the receiver can tune; said oscillator means including several piezoelectric crystals for determining the frequency of oscillation of said oscillator means;
   f. stepping means which is defeatable and which has several outputs which are coupled to said oscillator means for stepping said oscillator means through said given several frequencies;
   g. locking means which is connected to the stepping means for defeating said stepping means as long as an RF signal is being received and allowing resumption of operation of said stepping means when no signal is being received;
the improvement which comprises:
   an oscillator means having
   1. a first and a second transistor each having an emitter, base and collector, the emitter of said first transistor connecting directly to the base of said second transistor and the base of said first transistor connecting to said several crystals;
   2. means for causing said collector of said first transistor to be at A.C. ground;

3. a capacitor connected between the emitter of said second transistor and the base of said first transistor; and 4. a first parallel LC circuit coupled to the emitter of said second transistor.

2. The stepping radio receiver of claim 1 additionally including a second parallel LC circuit connected to the collector of said second transistor and additionally including several diodes each connecting on one side to a respective crystal and connecting on the other side both to the other of said several diodes and through a capacitor to A. C. ground.

3. The stepping radio receiver of claim 2 which includes 20 crystal sockets which connect to the base of said first transistor. 1

4. In a stepping radio receiver for production of audio signals from radio frequency signals and capable of tuning to several separate channels which radio receiver includes:

a. an RF signal receiving means, a mixer, and an oscillator means;

b. said RF signal receiving means being for providing sufficient RF signal level for said mixer means;

c. said RF signal receiving means and said oscillator means being coupled to said mixer means;

d. an audio detection means coupled to said mixer means for producing an audio signal when an RF signal is being received, said audio detection means including squelch means for preventing the production of an audio signal when an RF signal is not being received;

e. said oscillator means being coupled to said mixers and operable at a given several frequencies, there being one frequency for each channel to which the receiver can tune; said oscillator means including a first group of several sockets for piezoelectric crystals for determining a first group of frequencies of oscillation of said oscillator means;

f. stepping means which is defeatable and which has several outputs which are coupled to said oscillator means for stepping said oscillator means through said given several frequencies;

g. locking means which is connected to the stepping means for defeating said stepping means as long as an RF signal is being received and allowing resumption of operation of said stepping means when no signal is being received;

the improvement which comprises:

an oscillator means having:

1. a first, second and third transistor, 2. a second group of several sockets for piezoelectric crystals for determining a second group of frequencies of oscillation of said oscillator means, 3. said first group of several sockets coupling to said first transistor and said second group of several sockets coupling to said third transistor, 4. said first and third transistors connecting to said second transistor, 5. means connecting to said stepping means and to said first and third transistors to render said first and third transistors alternately operable in synchrony with said stepping means.

5. The stepping radio receiver of claim 4 in which said first and third transistors have first corresponding elements thereof connected directly together.

6. The stepping radio receiver of claim 5 in which said first and third transistors have second corresponding elements thereof connected directly together.

7. The stepping radio receiver of claim 6 in which the elements of each of said first, second and third transistors are emitter, base and collector and in which said first corresponding elements are emitters and said second corresponding elements are collectors.

8. The stepping radio receiver of claim 7 which additionally includes a first and second capacitor each having a first and second end, said first end of said first capacitor connecting to the base of said first transistor, said first end of said second capacitor connecting to the base of said third transistor and said second ends of said first and second capacitors connecting to the emitter of said second transistor.

9. The stepping radio receiver of claim 8 which additionally includes means for causing the collectors of said first and third transistors to be at A.C. ground.

10. The stepping radio receiver of claim 9 which additionally includes a first parallel LC circuit coupled to the emitter of said second transistor.

11. The stepping radio receiver of claim 10 in which the capacitance of said LC circuit is provided in part by a varactor diode.

12. The stepping radio receiver of claim 11 additionally including a second parallel LC circuit connected to the collector of said second transistor and additionally including several diodes each connecting on one side to a respective crystal and connecting on the other side both to the other of said several diodes and through a capacitor to A. C. ground.

13. The stepping radio receiver of claim 12 in which said first group of sockets includes 10 sockets and said second group of sockets includes 10 sockets.

* * * * *